(12) United States Patent
Fantoni

(10) Patent No.: US 7,966,137 B2
(45) Date of Patent: Jun. 21, 2011

(54) LINE RESONANCE ANALYSIS SYSTEM

(75) Inventor: Paolo F. Fantoni, Genoa (IT)

(73) Assignee: Wirescan AS, Halden (NO)

( * ) Notice: Subject to any disclaimer, the term of this patent is extended or adjusted under 35 U.S.C. 154(b) by 326 days.

(21) Appl. No.: 11/992,928

(22) PCT Filed: Oct. 3, 2006

(86) PCT No.: PCT/NO2006/000337
§ 371 (c)(1),
(2), (4) Date: Jul. 22, 2008

(87) PCT Pub. No.: WO2007/040406
PCT Pub. Date: Apr. 12, 2007

(65) Prior Publication Data
US 2009/0228222 A1 Sep. 10, 2009

Related U.S. Application Data

(60) Provisional application No. 60/722,450, filed on Oct. 3, 2005.

(51) Int. Cl.
*G01R 31/08* (2006.01)
(52) U.S. Cl. ........................................................ 702/59
(58) Field of Classification Search ................ 702/59, 702/60, 72, 76–77, 90, 96, 106, 142, 182, 702/183; 331/44–46, 60; 333/147
See application file for complete search history.

(56) References Cited

U.S. PATENT DOCUMENTS

| 4,077,023 A | * | 2/1978 | Boyd et al. ................... 333/147 |
| 4,307,267 A | | 12/1981 | Peoples ........................ 324/605 |
| 4,630,228 A | | 12/1986 | Tarczy-Hornoch et al. .... 702/59 |
| 2004/0039976 A1 | | 2/2004 | Gunther et al. ............... 714/742 |
| 2005/0057259 A1 | | 3/2005 | Hornsby et al. .............. 324/512 |

OTHER PUBLICATIONS

International Search Report mailed Feb. 2, 2007 for International Application No. PCT/NO06/000337.
International Preliminary Report on Patentability mailed Dec. 20, 2007 for International Application No. PCT/NO06/000337.

* cited by examiner

*Primary Examiner* — Mohamed Charioui
(74) *Attorney, Agent, or Firm* — Wenderoth, Lind, Ponack, L.L.P.

(57) ABSTRACT

The present invention provides a method for monitoring a condition of an electrical cable, the method including: providing a reference signal CH0 and a signal CH1, the signal CH1 being the reference signal CH0 after amplitude and phase modulation by a cable impedance $Z_{DUT}$ of the electrical cable; calculating the cable impedance $Z_{DUT}$ as a function of the applied signal frequency based on the reference signal CH0 and the signal CH1; and analyzing the cable impedance providing an assessment of the cable condition. A system performing the method is also disclosed.

6 Claims, 5 Drawing Sheets

LINE RESONANCE ANALYSIS SYSTEM

This application claims priority to U.S. Provisional Application No. 60/722,450 filed Oct. 3, 2005, the subject matter thereof incorporated herein by reference.

INTRODUCTION

The present invention provides a system and a method for monitoring of installed electrical cables based on line resonance analysis. For example, monitoring includes condition monitoring and real-time diagnosis of the electric cables. Throughout the present description the system is also referred to as LIRA (Line Resonance Analysis System). The cables have lengths ranging from a few meters to several hundred kilometers, depending on the cable structure and attenuation.

BACKGROUND

LIRA (Line Resonance Analysis System) is based on transmission line theory, an established and well documented theory that is at the base of two other existing cable fail detection techniques known as "Time Domain Reflectometry" (TDR) and "Frequency Domain Reflectometry" (FDR). Differences and limitations of these two existing techniques are explained in the following.

A transmission line is the part of an electrical circuit providing a link between a generator and a load. The behavior of a transmission line depends by its length in comparison with the wavelength $\lambda$ of the electrical signal traveling into it. The wavelength is defined as:

$$\lambda = v/f \tag{1}$$

where v is the speed of the electric signal in the wire (also called the phase velocity) and f the frequency of the signal.

When the transmission line length is much lower than the wavelength, as it happens when the cable is short (i.e. few meters) and the signal frequency is low (i.e. few KHz), the line has no influence on the circuit behavior. Then the circuit impedance ($Z_{in}$), as seen from the generator side, is equal to the load impedance at any time.

However, if the line length is higher than the signal wavelength, ($L \geq \lambda$), the line characteristics take an important role and the circuit impedance seen from the generator does not match the load, except for some very particular cases.

The voltage V and the current I along the cable are governed by the following differential equations, known as the telephonists equations:

$$\frac{d^2 V}{dz^2} = (R + j\omega L)(G + j\omega C)V \tag{2}$$

$$\frac{d^2 I}{dz^2} = (R + j\omega L)(G + j\omega C)I \tag{3}$$

where $\omega$ is the signal radial frequency, R is the conductor resistance, L is the inductance, C the capacitance and G the insulation conductivity, all relative to a unit of cable length.

These four parameters completely characterize the behavior of a cable when a high frequency signal is passing through it. In transmission line theory, the line behavior is normally studied as a function of two complex parameters. The first is the propagation function $$\gamma = \sqrt{(R+j\omega L)(G+j\omega C)} \tag{4}$$

often written as $$\gamma = \alpha j \beta \tag{5}$$

where the real part $\alpha$ is the line attenuation constant and the imaginary part $\beta$ is the propagation constant, which is also related to the phase velocity v, radial frequency $\omega$ and wavelength $\lambda$ through:

$$\beta = \frac{2\pi}{\lambda} \tag{6}$$

$$= \frac{\omega}{v}$$

The second parameter is the characteristic impedance $$Z_0 = \sqrt{\frac{R + j\omega L}{G + j\omega C}} \tag{7}$$

Using (4) and (7) and solving the differential equations (2) and (3), the line impedance for a cable at distance d from the end is:

$$Z_d = \frac{V(d)}{I(d)} \tag{8}$$

$$= Z_0 \frac{1 + \Gamma_d}{1 - \Gamma_d}$$

Where $\Gamma_d$ is the Generalized Reflection Coefficient $$\Gamma_d = \Gamma_L e^{-2\gamma d} \tag{9}$$

and $\Gamma_L$ is the Load Reflection Coefficient $$\Gamma_L = \frac{Z_L - Z_0}{Z_L + Z_0} \tag{10}$$

In (10) $Z_L$ is the impedance of the load connected at the cable end.

From eqs. (8), (9) and (10), it is easy to see that when the load matches the characteristic impedance, $\Gamma_L = \Gamma_d = 0$ and then $Z_d = Z_0 = Z_L$ for any length and frequency. In all the other cases, the line impedance is a complex variable governed by eq. (8), which has the shape of the curves in FIG. 1 (amplitude and phase as a function of frequency).

Existing methods based on transmission line theory try to localize local cable failures (no global degradation assessment is possible) by a measure of V (equation (2)) as a function of time and evaluating the time delay from the incident wave to the reflected wave. Examples of such methods are found in U.S. Pat. Nos. 4,307,267 and 4,630,228, and in US applications 2004/0039976 and 2005/0057259. Line attenuation and environment noise in real environments limit the sensitivity of such methods, preventing the possibility to detect degradations at an early stage, especially for cables longer than a few kilometers. In addition, no global cable condition assessment is possible, which is important for cable residual life estimation in harsh environment applications (for example nuclear and aerospace applications).

SUMMARY OF THE INVENTION

The object of the invention is to solve or at least alleviate the problems indicated above. To reduce background noise and increase sensitivity, the invention goes through a transformation into the domain of the line impedance (both amplitude and phase), also called the domain of t', and applies frequency analysis in this domain. The steps involved in this process are:

1. Send an extended bandwidth signal through the cable and measure the reflected signal;
2. Estimate the line impedance through the entire bandwidth on the basis of the send and reflected signals;
3. Analyze the line impedance to get information about cable properties, global cable condition, local degradation spots.

In a first aspect, the invention provides a method of monitoring a condition of an electrical cable, the method comprising providing a reference signal CH0, and a signal CH1, said signal CH1 being the reference signal CH0 after amplitude and phase modulation by a cable impedance $Z_{DUT}$ of the electrical cable; calculating the cable impedance $Z_{DUT}$ as a function of the applied signal frequency based on the reference signal CH0 and the signal CH1; and analyzing said cable impedance providing an assessment of the cable condition.

In an embodiment, the reference signal CH0 may be a white noise signal having a frequency bandwidth from $w_1$ to $w_2$, or a frequency sweep from a frequency $w_1$ to a frequency $w_2$, $w_1$ and $w_2$ depending on the cable length. The method may further comprise calculating an amplitude and phase of the cable impedance $Z_{DUT}$ as a function of frequency, by calculating the averaged windowed transfer function from the reference signal CH0 to the signal CH1 by using $$Z_{DUT} = Z_1 \left( \frac{V_0}{V_1} - 1 \right)$$

where $Z_1$ is an internal impedance of a digitizer channel for signal CH1, and $v_0$ and $v_1$ are the voltage phasors measured at a digitizer channel for reference signal CH0 and a digitizer channel 1 for signal CH1, respectively. In an even further embodiment, the method may comprise evaluating at least one resonance frequency pattern of the cable impedance $Z_{DUT}$, wherein said at least one resonance frequency pattern provides information concerning cable degradation.

Said at least one resonance frequency pattern may be a Fourier transform of the impedance phase and amplitude, the method further comprising identifying a fundamental frequency f' in the Fourier transform due to a wave reflection at a distance d, wherein said distance d is a cable termination, identifying a further frequency component f'' in the Fourier transform due to a wave reflection at a location x, wherein said wave reflection at location x is due to a discontinuity in electrical parameters of said cable, and calculating said location x by:

$$\frac{f'}{f''} = \frac{d}{x}$$

d being the length of said cable.

Said at least one resonance frequency pattern may be a Fourier transform of the impedance phase and amplitude, the method may in an alternative embodiment comprise identifying a fundamental frequency f' in the Fourier transform due to a wave reflection at a distance d, wherein said distance d is a cable termination, identifying a further frequency component f'' in the Fourier transform due to a wave reflection at a location x, wherein said wave reflection at location x is due to a discontinuity in electrical parameters of said cable, and calculating said location x by:

$$x = \frac{v_r v_0 f''}{2}$$

wherein $v_r$ is the relative phase velocity of an electrical signal in the cable, and $v_0$ the speed of light in vacuum.

In an even further embodiment of the invention, said at least one resonance frequency pattern is a Fourier transform of the impedance phase and amplitude, the method further comprising identifying two consecutive resonance frequency values $f_k$ and $f_{k+1}$ respectively, of the cable impedance $Z_{DUT}$; calculating a first value of a relative phase velocity $v_r$ of the cable by applying $v_r = 2L(f_{k+1}-f_k)/v_0$, where L is the length of the cable and $v_0$ is the light speed in vacuum; calculating a fundamental frequency f' of said cable using said first relative phase velocity $v_r$ and applying $$f' = \frac{2L}{v_r v_0},$$

where L is the length of the cable and $v_0$ is the light speed in vacuum; calculating a second value f'' of said fundamental frequency f' by finding a maximum peak value in the Fourier transform in the domain of t' in a selectable interval around f'; and calculating a final relative phase velocity $v_r^{final}$ by applying $$v_r^{final} = \frac{2L}{v_0 f''},$$

where L is the length of the cable, $v_0$ is the light speed in vacuum, wherein said relative phase velocity provides information about global degradation of said cable.

In an even further embodiment providing information about global degradation of the cable, the method comprises calculating a cable impedance phase shift, wherein said reference signal CH0 is a multi-tone sine wave at a resonance frequency, and calculating a phase difference between CH0 and CH1 in the time domain.

In a second aspect the invention provides a system of condition monitoring of an electrical cable, the system comprising a generating means providing a reference signal CH0; an acquisition means acquiring said reference signal CH0 and a signal CH1, said signal CH1 being the reference signal CH0 after amplitude and phase modulation by a cable impedance $Z_{DUT}$ of the electrical cable; and an analyzing means calculating the complex cable impedance $Z_{DUT}$ as a function of the applied signal frequency based on the reference signal CH0 and the signal CH1, and analyzing said cable impedance providing an assessment of cable condition and/or cable failure.

Said generating means may be operative to provide a reference signal CH0 selected from a group consisting of a white noise signal having a frequency bandwidth from 0 to a selectable frequency $w_2$, a sweep signal having a frequency bandwidth from $w_1$ to $w_2$ (both selectable), and a multi-tone sine wave at selected resonance frequencies.

The acquisition means may be a digital storage oscilloscope.

The system may further comprise a simulator operative to provide the analyzing means with said reference signal CH0 and said signal CH1 based on cable parameters, load parameters and transmission line equations. A modulator may also be arranged between said generating means and said acquisition means, said modulator being connected to the electrical cable, and being operative to output the reference signal CH0 and said cable impedance phase and amplitude modulated signal CH1.

In the claims the term monitor is to be widely interpreted and includes, for example, global/local condition monitoring, real-time diagnosis, and fault detection.

LIRA (Line Resonance Analysis System) improves the detection sensitivity and accuracy by analyzing the cable input impedance (equation (8) and FIG. 1). In essence, the following steps are provided:

Local degradation detection and localization:
a. Noiseless estimation of the line input impedance as a function of frequency (bandwidth 0-X MHz, where X depends on the cable length).
b. Use of a hardware module called "Modulator" for the estimation of the line input impedance.
c. Spectrum analysis of the line input impedance to detect and localize degradation spots (see detailed explanation).

Global degradation assessment:
a. Same as point a above
b. Same as point b above
c. Spectrum analysis of the line input impedance to estimate the right value of the phase velocity (equation (1)). The phase velocity is used as a condition indicator of the cable global state.

These steps are explained in detail later in this document.

LIRA (Line Resonance Analysis System) according to the invention is able to monitor the global, progressive degradation of the cable insulation due to harsh environment conditions (e.g. high temperature, humidity, radiation) and detect local degradation of the insulation material due to mechanical effects or local abnormal environment conditions. In this case, LIRA can estimate the location of the challenged part with an estimation error within 0.5% of the cable length.

The LIRA system may be used for detecting and monitoring insulation degradation and line breakage in all kinds of electrical cables (power and signal cables); i.e. cables in power generation, distribution and transmission, cables in process industries, cables in aerospace industry, on cable in onshore, offshore and subsea installations, and identify the position of the damage/breakage. The monitoring and detection may be performed from a remote location in real time.

The invention is defined in the appended claims.

BRIEF DESCRIPTION OF DRAWINGS

Embodiments of the invention will now be described with reference to the following drawings, where.

DETAILED DESCRIPTION OF THE INVENTION

Figure 2:
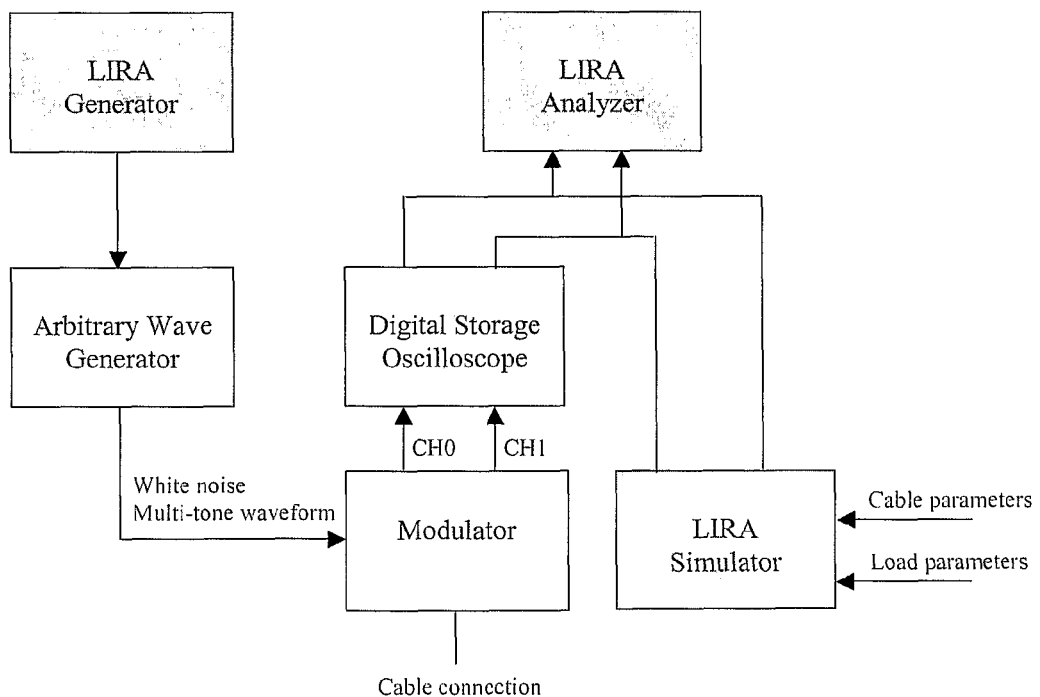
FIG. 2 shows hardware and software modules of a system according to an embodiment of the invention.
Figure 3:
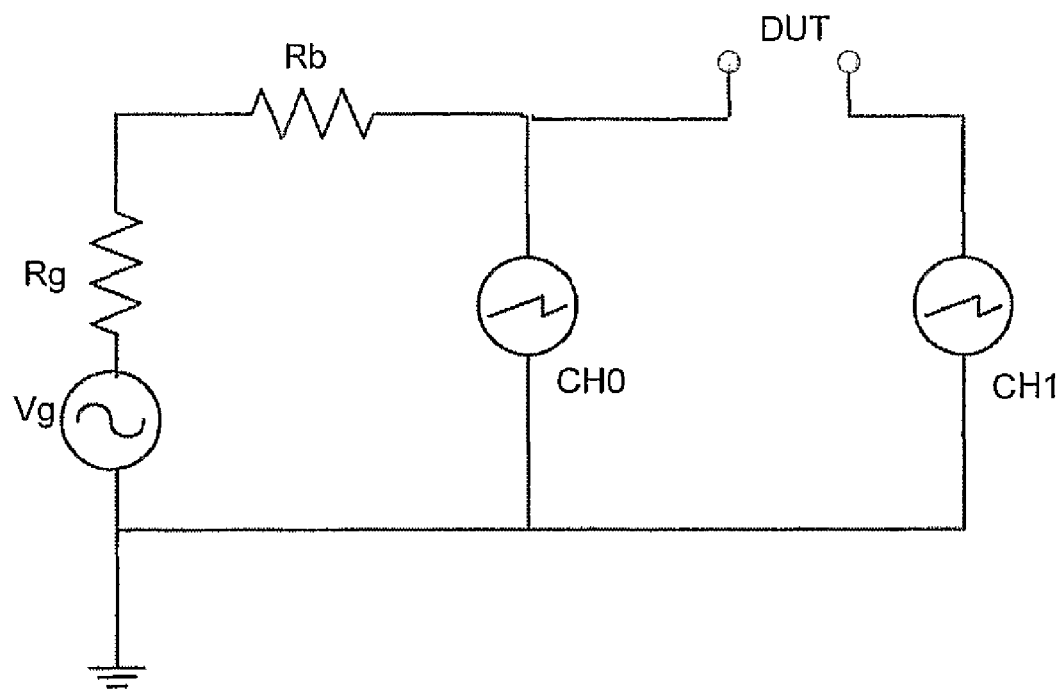
FIG. 3 shows a functional design of a modulator according to an embodiment of the present invention.

FIG. 2 shows an embodiment of the system with hardware and software modules. These modules will be described below.

The Arbitrary Wave Generator. It is driven by the LIRA Generator software to supply the system with a reference signal CH0. The reference signal can be:
A white noise signal.
A sweep signal, from 0 Hz to the selected bandwidth. Same effect as of a white noise signal.
A multi-tone sine wave. This is used for real-time monitoring of impedance phase shifts.

Figure 4:
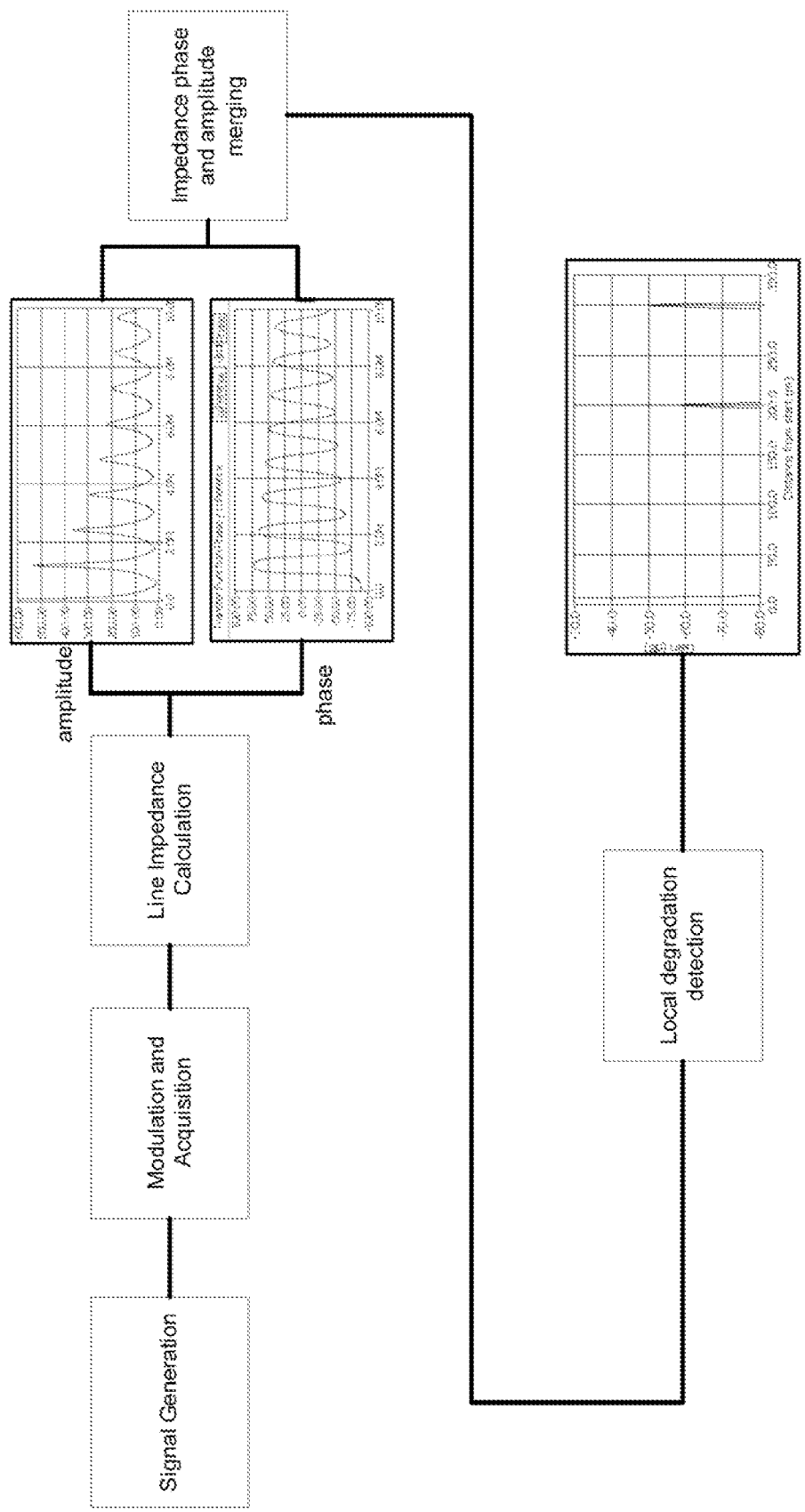
FIG. 4 shows a functional diagram of a spot detection algorithm according to an embodiment of the invention.

The Modulator. A functional diagram of the modulator is shown in FIG. 4. The output of this module is the reference signal (CH0), distorted by the generator internal impedance Rg, and a phase and amplitude modulated signal (CH1), which is modulated by the frequency dependent impedance $Z_{DUT}$ of the cable provided to the modulator through a cable connection.

The modulator functional diagram is shown in FIG. 4, where DUT is the connection to the cable under test. The impedance at DUT is calculated as:

$$Z_{DUT} = Z_1 \left( \frac{V_0}{V_1} - 1 \right) \quad (11)$$

where $Z_1$ is the digitizer channel 1 (CH1) internal impedance (50 ohm) and $v_0$ and $v_1$ are the voltage phasors measured at digitizer channel 0 (CH0) and channel 1 (CH1).

From equation (11) it follows that there is no influence on $Z_{DUT}$ from Rb, Rg and any parasitic impedance on the left of CH0. $Z_1$ has some known capacitance (15 pF) that the system can easily take into consideration. Equation (11) shows that the cable input impedance is a simple function of the reciprocal of the transfer function between $v_0$ and $v_1$, both acquired by the digital storage oscilloscope. LIRA performs a windowed transfer function with an average technique to remove noise and applies eq. (11) to estimate the line impedance in the applicable bandwidth.

The 2-channel Digital Storage Oscilloscope. It is used to acquire CH0 and CH1. This is a commercial hardware unit.

The LIRA simulator. This module can be operated stand alone, or it can be connected to the LIRA Analyzer. In the last case the LIRA simulator works in the frequency domain applying the transmission line equations (Eqs. 1 to 10) and then performing an inverse Fourier transformation to provide the analyzer with the two time domain signal channels (CH0, CH1), as they came directly from the Modulator connected to the tested cable. In addition to that, it employs a stochastic model to evaluate the uncertainties in the cable electrical parameters due to manufacturing tolerances and environment changes. Cable parameters and load parameters for the actual cable connection are input to the LIRA simulator.

The stochastic model evaluates and applies statistical variations (using a normal distribution with user selected standard deviation) in the electrical parameters (L, C and R) along the cable, due to manufacturing tolerances and environment noise.

The LIRA Analyzer. It can be operated in real or simulation mode. In the first case it takes the input from the 2-channel Digital Storage Oscilloscope, in the second case the input comes from the LIRA simulator module. The LIRA Analyzer is the core of the wire monitoring system. The LIRA Analyzer works both in the frequency and the time domain, performing the following tasks:

Estimate and display the frequency spectrum of the line input impedance.

Calculate the resonance frequencies. Resonance frequencies are calculated from the impedance spectrum and correspond to frequency values where the phase is zero.

Estimate the cable characteristic impedance $Z_{DUT}$. It is also calculated from the impedance spectrum. The characteristic impedance is the value of the impedance amplitude at any local maximum (or minimum) of the impedance phase.

Estimate the cable length, if not known.

Detect local degradation areas and localize it.

Detect load changes.

Measure and display the amplitude ratio and the phase shift between the 2 acquired channels (CH0 and CH1). This is done when the reference signal is a multi-tone sine wave and LIRA evaluates, in the time domain, the phase shift between the two channels. The phase shift is initially zero, at resonance conditions, and any deviation from that can be correlated to a change in the average cable electrical parameters.

Diagnosis and Localization of Local Degradation

LIRA implements 2 algorithms for the detection of local insulation defects, referred to as the PRN (Pseudo Random Noise) method and the SWEEP method. The PRN method is the preferred method for cable lengths below 200 m, while the SWEEP method is used for longer cables. Both methods follow the scheme in FIG. 4 and they differ only in the shape of the generated reference signal CH0. These methods will therefore be explained in the following with reference to the PRN method, but the explanation will be equally applicable for the SWEEP method.

In the PRN method, the line impedance is calculated as the averaged windowed transfer function from the reference signal CH0 to the impedance modulated signal CH1, which results in the calculation of the amplitude and phase of the line impedance $Z_{DUT}$ as a function of frequency (See Eq. (11)). Once the line impedance is calculated, the cable state is analyzed by the examination of the frequency content of the amplitude and phase components of the complex impedance. This will be explained in the following.

Figure 1:
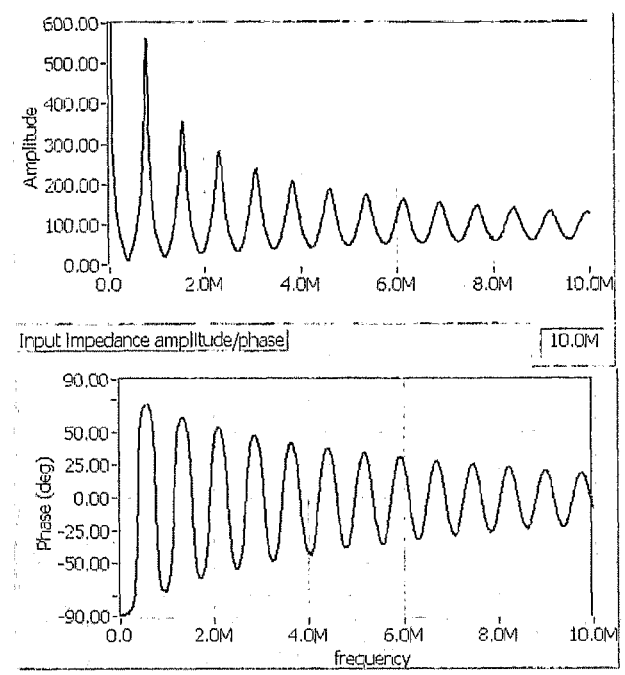
FIG. 1 shows a graphical representation of a complex line impedance amplitude and phase as a function of frequency according to equation (8)

Eq. (8) is the mathematical expression of the function in FIG. 1. Actually, the line impedance $Z_d$ (for a cable at distance d from the end of the cable) is a complex parameter, and FIG. 1 shows both the amplitude and phase of it. The pseudo-periodic shape of the phase is due to the periodicity of $\Gamma_d$, Eq. (9), that can be rewritten as:

$$\Gamma_d = \Gamma_L e^{-2\alpha d} e^{-2j\beta d} \quad (12)$$

where the amplitude is decreasing with d (the cable length) because of the attenuation α (the phase is periodic if α=0). The period of $\Gamma_d$ (and then of the line impedance phase) is 1/2β, considering d as the independent variable, or 1/2d, considering β the independent variable (as in FIG. 1).

Using the expression for the propagation constant β from Eq. (6), Eq. (12) can be rewritten as:

$$\Gamma_d = \Gamma_L e^{-2\alpha d} e^{\frac{-2j\omega d}{v}} \quad (13)$$

$$\Gamma_d = \Gamma_L e^{-2\alpha d} e^{\frac{-4j\pi f d}{v}} \quad (14)$$

where f is the frequency of the applied signal and v is the phase velocity of the electrical signal in the cable.

Assuming f as the independent variable and writing the following translations:

$$f \to t' \quad (15)$$

$$\frac{4\pi d}{v_r v_0} \to \omega' \quad (16)$$

where $v_r = v/v_0$, $v_r$ being the relative phase velocity of the electrical signal in the cable, and $v_0$ the speed of light in a vacuum.

$$\Gamma_L e^{-2\alpha d} = A \quad (17)$$

Eq. (14) becomes:

$$\Gamma_d = A e^{-j\omega' t'} \quad (18)$$

Figure 5:
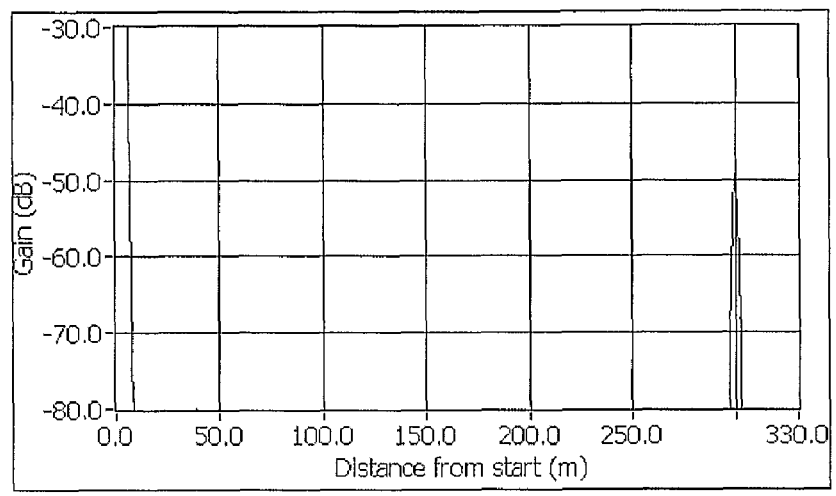
FIG. 5 is a power spectrum of a phase impedance in a domain of t', where the x-axis has been scaled to distance from cable start (d=300 m), according to an embodiment of the present invention.

Equation (18) is the mathematical expression of a pseudo-periodic function of radial frequency ω' and amplitude A. In the lossless case (α=0), A=1. In real life lossy cables, α is an increasing function of signal frequency, so that amplitude A is a decreasing function of t', thereby resulting in the damped oscillation of FIG. 1. The frequency of this function (in the domain of t') is:

$$f' = \frac{\omega'}{2\pi} \quad (19)$$
$$= \frac{2d}{v_r v_0}$$

where f' is the fundamental frequency of the phase function in the domain of t' due to the wave reflection at distance d (the cable termination). Note that the expression of f' has the dimension of time and it is the time, elapsed for a wave to reach the termination at the distance d and be reflected back. The Fourier transform (power spectrum) of the impedance phase, in the domain of t', looks for example, like FIG. 5, where the x-axis has been scaled to d at the fundamental frequency given in Eq. (19). In FIG. 5, the x-axis has been scaled to a distance from cable start (d=300 m).

When at a distance x, the wave finds a discontinuity in the electrical parameters of the cable (for example, a small change in the insulation dielectric). As such, another reflection would be visible from distance x, which would add a new frequency component in the power spectrum of the impedance phase, where the frequency (from Eq. (19)) would be:

$$f'' = \frac{2x}{v_r v_0} \quad (20)$$

And so:

$$\frac{f'}{f''} = \frac{d}{x} \quad (21)$$

If the cable length is known, the knowledge of f' and f" from the power spectrum of the impedance phase (in the domain of t') is sufficient for the calculation of the x location:

$$x = d\frac{f''}{f'} \quad (22)$$

If d is not known, the knowledge of the relative phase velocity $v_r$ (from the cable datasheet or by measuring it on a cable sample of the same type) can be used to calculate the x location based on Eq. (19):

$$x = \frac{v_r v_0 f''}{2} \quad (23)$$

Figure 6:
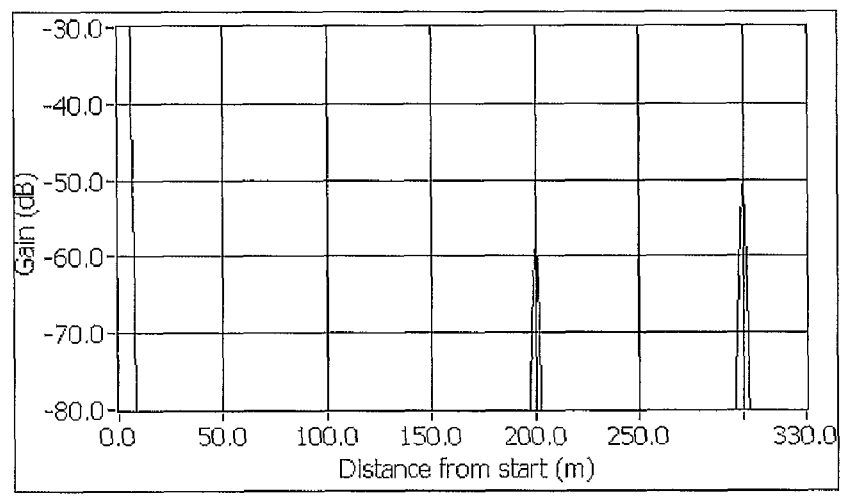
FIG. 6 is a power spectrum of phase impedance in the domain of t', where the frequency component at x=200 is visible, due to a capacity change of 20 pF in a 30 cm cable segment, according to an embodiment of the present invention.

The final result is then a spike at any position where a change (even a very small change) of electrical parameters (mainly a dielectric value change) produces a reflected wave of the applied reference signal. This reflection appears as a frequency component in the phase/amplitude spectrum of the line impedance. The frequency of the reflected wave is a linear function of the distance from the cable end to the deviation. FIG. 6 shows a Fourier transform (power spectrum) of phase impedance in the domain of t', where a reflection due to a change of electrical parameters of the cable at location x=200 m from cable start is visible as a frequency component at x=200. This spike is, in the case of FIG. 6, due to a capacity change of 20 pF in a 30 cm segment of the cable under test.

When condition monitoring a cable, a number of discontinuities (n) in the electrical parameters of the cable may be present. Each of these discontinuities will appear in the power spectrum as distinct frequency components spikes $f_n$, and their positions $x_n$ identified as explained above.

In order to have good sensitivity and digital resolution, it is important to operate with the highest possible bandwidth, which is however limited by the cable attenuation. Successful tests have been performed with 30 m cables (100 MHz bandwidth) up to 120 Km cables (20 KHz bandwidth) at the time of writing. Long cables require narrow bandwidths to overcome the increasing cable attenuation, which is a function of frequency.

Global Degradation Monitoring

LIRA makes use of 2 different methods for monitoring global changes in the cable condition:
1. The Relative Phase Velocity estimation and monitoring.
2. The line impedance phase shift from any resonance condition.

As for the local degradation and diagnosis, the first method for global degradation is also based on applying a reference signal CH0 having a frequency bandwidth from $w_1$ to $w_2$, which is then phase and amplitude modulated by the cable impedance $Z_{DUT}$ of the cable under test, providing the signal CH1. The second method is based on applying a multi-tone sine wave as a reference signal CH0. The analysis of the resulting signals CH0 and CH1 is explained in detail for the two methods below.

Method 1:
The Relative Phase Velocity is calculated by LIRA through a 2 step process:
1. A first approximate value is estimated using 2 consecutive resonance frequency values in the line impedance, applying the following equations: At any resonance, the cable length L is exactly equal to half wavelength or any multiple of that (this is true when the cable is open ended, but different load reactances can be easily accounted for), or, using Eq. (1):

$$L = \frac{v_r v_0}{2 f_k} k \quad (24)$$

where L is the cable length, $v_0$ is the speed of light in a vacuum, $v_r$ is the relative phase velocity and $f_k$ is the $k^{th}$ resonance peak frequency. Applying Eq. (24) to two consecutive resonance peaks, we get:

$$v_r = 2L(f_{k+1} - f_k)/v_0 \quad (25)$$

Eq. (25) is used by LIRA to evaluate a first value of $v_r$, after the estimation of the cable input impedance and the calculation of the resonance frequencies. Note that any load reactance shift would be eliminated by the difference term in the equation. The reason why this value is approximate is that $v_r$ is a slow function of f, but it has been assumed constant in Eq. (25).

2. The value of $v_r$ found in step 1 is used to calculate the approximate value of the fundamental frequency f' (domain of t', see description above and FIG. 5), as:

$$f' = \frac{2L}{v_r v_0} \quad (26)$$

LIRA searches the maximum peak f" in the Fourier transform (power spectrum) in the domain of t', in a user selectable interval around f'. When an accurate value of f' (called f") is found from the spectrum, Eq. (19) is solved for $v_r$ as:

$$v_r^{final} = \frac{2L}{v_0 f''} \quad (27)$$

which is the final and accurate value of the phase velocity. The phase velocity decreases with the degradation of the cable insulation.

Method 2:
The line impedance has zero phase at any resonance condition. Using a sine wave at a resonance frequency as a reference signal, the 2 output signals CH0 and CH1 are in phase. The phase difference between CH0 and CH1 (even in the order of 1 deg), calculated in the time domain, is used to monitor any small change in the global electrical condition of the cable because changes in the electrical parameters affect the cable resonance frequencies. Rather than monitoring frequency changes directly, LIRA monitors the impedance phase because it can be estimated in a more reliable and accurate way. This method is suitable for unattended, real-time monitoring of cable global conditions.

Figure 7:
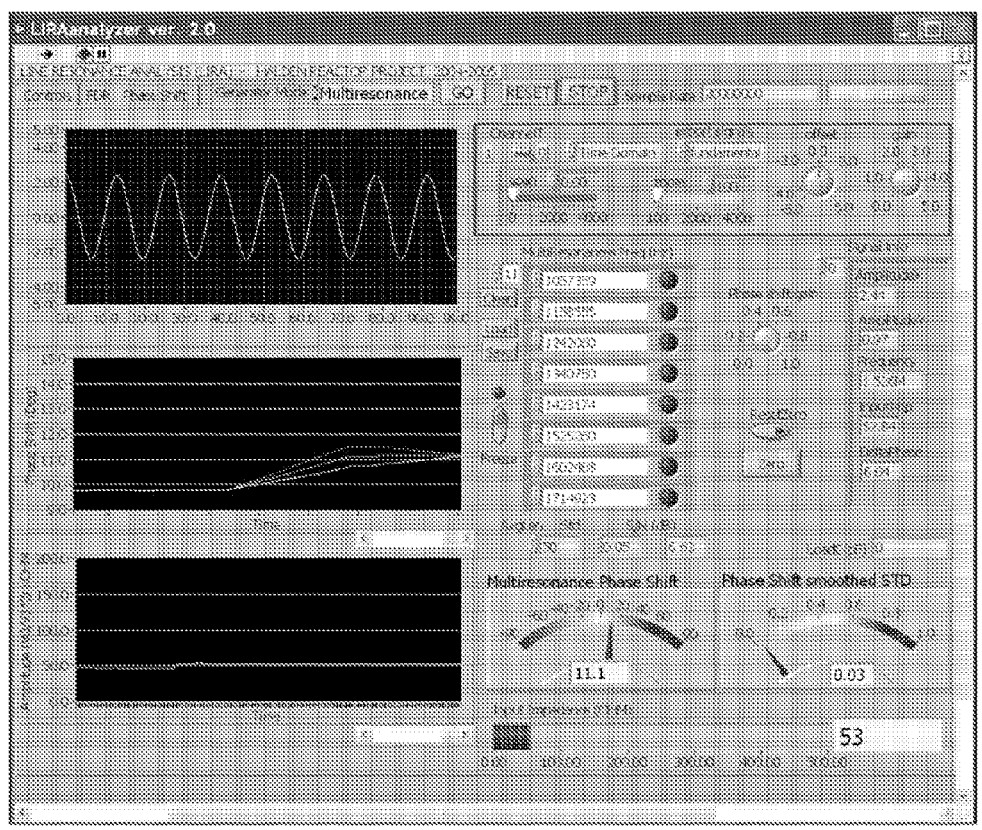
FIG. 7 illustrates a real-time monitoring of impedance phase shift in an analyzing means according to an embodiment of the invention.

FIG. 7, shows an example of impedance phase shift monitoring using the LIRA (Line Resonance Analysis) system. The LIRA system shows in the graph, in the middle left of FIG. 7 the phase shift between a reference signal CH0 and the resulting signal CH1 modulated by the cable impedance as a function of time. The phase shift provides information concerning the insulation degradation.

The reasons why a resonance frequency is used for this purpose are:
   The phase derivative is the highest at resonance, thereby achieving the maximum sensitivity to cable degradation.
   The phase changes linearly around a resonance condition. This makes it easier to correlate a phase shift to the insulation degradation.

Having described preferred embodiments of the invention it will be apparent to those skilled in the art that other embodiments incorporating the concepts may be used. These and other examples of the invention illustrated above are intended by way of example only and the actual scope of the invention is to be determined from the following claims.

The invention claimed is:

1. A method for monitoring a condition of an electrical cable, said method comprising the steps of:
   calculating, using an LIRA analyzer, a complex cable impedance $Z_{DUT}$ as a function of a frequency f specified by an amplitude and a phase, wherein the frequency f is a frequency of a multifrequency signal wave applied to the cable by a modulator, and wherein the multifrequency signal wave is phase and amplitude modulated by a cable impedance;
   translating the calculated complex cable impedance into a time domain t';
   calculating a frequency f' in the time domain t', wherein the frequency f' is the fundamental frequency of a pseudo-periodic function of radial frequency ω' and amplitude A in the time domain t' due to wave reflection of the multifrequency signal wave at a distance d from an end of the cable, and wherein the frequency f' is calculated by applying:

$$f' = \frac{\omega'}{2\pi} = \frac{2d}{v_r v_0}$$

in which $v_0$ is the speed of light in a vacuum and $v_r$ is an estimated relative phase velocity of an electrical signal in the cable;
   performing a power spectrum analysis of both amplitude and phase of the complex cable impedance in the time domain t' to find and localize any local degradation to insulation of the cable;
   identifying frequency components $f''_1, f''_2, f''_n$, in the power spectrum of the time domain t' due to wave reflections of the multifrequency signal wave at locations $x_1, x_2, \ldots, x_n$ along the cable, the wave reflections being due to discontinuities in electrical parameters of the cable; and
   calculating each of the locations $x_i$ by applying:

$$x_i = \frac{v_r v_0 f''_i}{2}.$$

2. The method of claim 1, further comprising
   estimating, using the LIRA analyzer, the estimated relative phase velocity $v_r$,
   wherein the estimating the estimated relative phase velocity $v_r$ includes:
      evaluating at least two resonance frequencies of the complex cable impedance $Z_{DUT}$;
      identifying two consecutive resonance frequency values $f_k$ and $f_{k+1}$ respectively, of the complex cable impedance $Z_{DUT}$;
      calculating a first value of a relative phase velocity $v_r$ of the cable by applying $v_r = 2L(f_{k+1} - f_k)/v_0$, where L is the length of the cable;
      calculating the fundamental frequency f' of the cable, in the time domain t', using the first relative phase velocity $v_r$ and applying $$f' = \frac{2L}{v_r v_0};$$

calculating a second value f'' of the fundamental frequency f' by finding a maximum peak value in the time domain t' in a selectable interval around f'; and
      calculating the estimate of the relative phase velocity $v_r^{final}$ by applying $$v_r^{final} = \frac{2L}{v_0 f''}.$$

3. The method of claim 1,
   wherein the modulator outputs a reference signal (CH0), that is a white noise signal, to the cable and to the LIRA analyzer,
   wherein the modulator receives a reflected signal from the cable and outputs a modulated signal (CH1) to the LIRA analyzer, the modulated signal (CH1) being the multifrequency signal wave which is phase and amplitude modulated by the cable impedance, and
   wherein the LIRA analyzer estimates the amplitude and the phase of the cable impedance based on the signals (CH0, CH1) outputted from the modulator.

4. A system for monitoring a condition of an electrical cable, said system comprising:
   an analyzer for calculating a complex cable impedance ZDUT as a function of a frequency f specified by an amplitude and phase;
   a generating means for generating a multifrequency signal wave that is to be phase and amplitude modulated by a cable impedance, the multifrequency signal wave being applied to the cable, wherein the frequency f is a frequency of the mulifrequency signal wave a translating means for translating the complex cable impedance $Z_{DUT}$ into a time domain t';
   wherein said analyzer calculates a frequency f' in the time domain t', wherein the frequency f' is the fundamental frequency of a pseudo-periodic function of radial frequency ω' and amplitude A in the time domain t' due to wave reflection of the multifrequency signal wave at a distance d from an end of the cable, and wherein the frequency f' is calculated by applying:

$$f' = \frac{\omega'}{2\pi} = \frac{2d}{v_r v_0}$$

in which $v_0$ is the speed of light in a vacuum and $v_r$ is an estimated relative phase velocity of an electrical signal in the cable, wherein said analyzer performs a power spectrum analysis of both amplitude and phase of the complex cable impedance in the time domain t' to find and localize any local degradation to insulation of the cable, wherein said analyzer identifies frequency components $f''_1, f''_2, \ldots f''_n$ in the power spectrum of the time domain t' due to wave reflections at locations $x_1, x_2, \ldots, x_n$ along the cable, the wave reflections being due to discontinuities in electrical parameters of the cable, and wherein said analyzer calculates each of the locations $x_i$ by applying:

$$x_i = \frac{v_r v_0 f''_i}{2}.$$

5. The system of claim 4,
wherein said analyzer is operable to:
evaluate at least two resonance frequencies of the complex cable impedance $Z_{DUT}$;
identify two consecutive resonance frequency values $f_k$ and $f_{k+1}$ respectively, of the complex cable impedance $Z_{DUT}$;
calculate a first value of a relative phase velocity $v_r$ of the cable by applying $$v_r = 2L(f_{k+1} - f_k)/v_o,$$

where L is the length of the cable;

calculate the fundamental frequency f' of the cable using the first relative phase velocity $v_r$ and applying $$f' = \frac{2L}{v_r v_0};$$

calculate a second value f'' of the fundamental frequency f' by finding a maximum peak value in the time domain t' in a selectable interval around f'; and calculate the estimate of the relative phase velocity $v_r^{final}$ by applying $$v_r^{final} = \frac{2L}{v_0 f''}.$$

6. The system of claim 4,
wherein said modulator is connected between said generating means and said analyzer,
wherein said modulator is connected to the electrical cable for outputting a reference signal (CH0) thereto and to said analyzer, and
wherein said modulator receives a reflected signal from the cable and outputs a modulated signal (CH1) to said analyzer, said modulated signal (CH1) being the mulitfrequency signal wave which is phase and amplitude modulated by the cable impedance.

* * * * *